(12) United States Patent
Abdelmoneum et al.

(10) Patent No.: US 12,439,826 B2
(45) Date of Patent: Oct. 7, 2025

(54) INTEGRATED MEMS RESONATOR AND METHOD

(71) Applicant: Intel Corporation, Santa Clara, CA (US)

(72) Inventors: Mohamed A Abdelmoneum, Portland, OR (US); Eduardo Alban, Hillsboro, OR (US); Whitney Bryks, Chandler, AZ (US); Brent R. Carlton, Portland, OR (US); Tarek A. Ibrahim, Mesa, AZ (US); Nasser A. Kurd, Portland, OR (US); Jason Mix, Portland, OR (US); Srinivas Venkata Ramanuja Pietambaram, Chandler, AZ (US); Sarah Shahraini, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 1051 days.

(21) Appl. No.: 17/482,056

(22) Filed: Sep. 22, 2021

(65) Prior Publication Data

US 2023/0085673 A1    Mar. 23, 2023

(51) Int. Cl.
| | | |
|---|---|---|
| *H01L 41/047* | (2006.01) | |
| *B81B 3/00* | (2006.01) | |
| *H03H 9/02* | (2006.01) | |
| *H10N 30/09* | (2023.01) | |
| *H10N 30/20* | (2023.01) | |
| *H10N 30/853* | (2023.01) | |

(52) U.S. Cl.
CPC ......... *H10N 30/853* (2023.02); *B81B 3/0018* (2013.01); *H03H 9/02244* (2013.01); *H10N 30/09* (2023.02); *H10N 30/20* (2023.02); *B81B 2201/0271* (2013.01)

(58) Field of Classification Search
CPC ....... H10N 30/853; H10N 30/85; H10N 30/88
USPC ......................................... 310/340, 344, 348
See application file for complete search history.

(56) References Cited

U.S. PATENT DOCUMENTS

| | | | |
|---|---|---|---|
| 2005/0212387 A1* | 9/2005 | Sasagawa ............ | H03H 9/1021 310/348 |
| 2007/0152537 A1* | 7/2007 | Yamaguchi ............. | G01L 17/00 310/311 |
| 2008/0042524 A1* | 2/2008 | Shibata .................. | H03H 9/105 29/25.35 |
| 2017/0069820 A1* | 3/2017 | Hada ...................... | H03H 9/174 |

(Continued)

FOREIGN PATENT DOCUMENTS

| | | |
|---|---|---|
| CN | 115913165 | 4/2023 |
| EP | 3403992 | 11/2018 |
| EP | 3716320 | 9/2020 |

OTHER PUBLICATIONS

"European Application Serial No. 22191303.1, Extended European Search Report mailed Feb. 20, 23", 12 pgs.

(Continued)

*Primary Examiner* — Derek J Rosenau
(74) *Attorney, Agent, or Firm* — Schwegman Lundberg & Woessner, P.A.

(57) ABSTRACT

An electronic device and associated methods are disclosed. In one example, the electronic device includes a MEMS die located within a substrate, and below a processor die. In selected examples, the MEMS die includes a resonator. Example methods of forming MEMS resonator devices are also shown.

21 Claims, 8 Drawing Sheets

(56) References Cited

U.S. PATENT DOCUMENTS

2017/0217177 A1\* 8/2017 Takabe ................. B41J 2/14072
2020/0285267 A1 9/2020 Abdelmoneum et al.

OTHER PUBLICATIONS

Abdolvand, R, "7E-4 Enhanced Power Handling and Quality Factor in Thin-Film Piezoelectric-on-Substrate Resonators", Ultrasonics Symposium, IEEE, IEEE, Piscataway, NJ, USA, (Oct. 1, 2007), 608-611.
Diego, E Serrano, "Electrostatically tunable piezoelectric-on-silicon micromechanical resonator for real-time clock" IEEE Transactions on Ultrasonics, Ferroelectrics, and Frequency Control, IEEE, USA, vol. 59, No. 3, (Mar. 1, 2012), 358-365.
Wojciechowski, Kenneth E, "A Fully Integrated Oven Controlled Microelectromechanical Oscillator-Part I: Design and Fabrication", Journal of Microelectromechanical Systems, IEEE Service Center, US, vol. 24, No. 6, (Dec. 1, 2015), 1782-1794.
"European Application Serial No. 22191303.1, Response filed Sep. 29, 2023 to Extended European Search Report mailed Feb. 20, 2023", 13 pgs.

\* cited by examiner

INTEGRATED MEMS RESONATOR AND METHOD

TECHNICAL FIELD

Embodiments described herein generally relate resonators for timing in electronic devices such as computing systems.

BACKGROUND

Commonly, resonators are used in timing circuits that work in conjunction with processors and other semiconductor dies in electronic devices. However, resonators are typically coupled to a circuit board adjacent to an associated semiconductor die. It is desired to have smaller and less expensive resonators.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
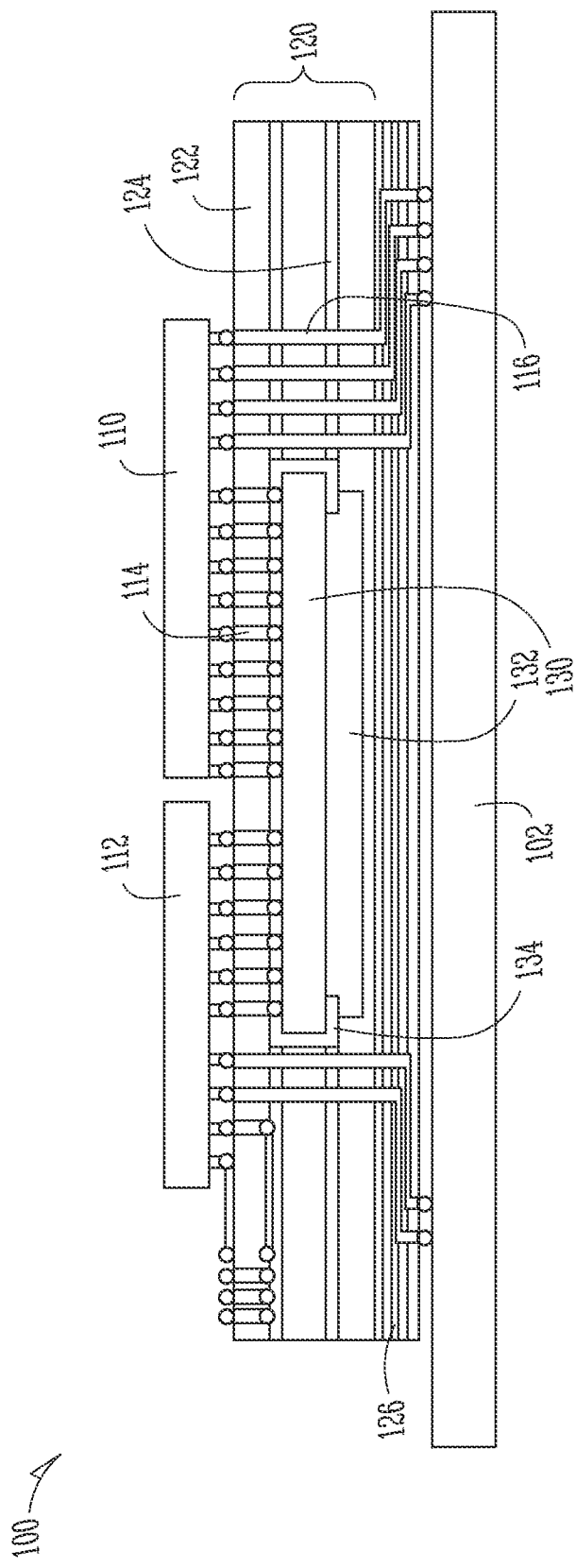
FIG. 1 shows an electronic device having a resonator die in accordance with some example embodiments.

FIG. 1 shows an electronic device 100 according to one example. The electronic device 100 includes a first semiconductive die 110 and a second semiconductive die 112. The dies 110, 112 are shown coupled to a substrate 120. In one example, one or more of the dies 110, 112 includes a processor die or processor core. Other example dies include controller dies, memory dies, etc. Although two dies are shown in FIG. 1, the invention is not so limited. A single die may be used, or more than two dies may be used in configurations of the present disclosure. FIG. 1 further shows one or more redistribution layers 126 on a bottom surface of the substrate 120, and a circuit board 102 coupled to the redistribution layers 126.

In one example, the substrate 120 is a glass substrate, although the invention is not so limited. Examples of a glass substrate 120 include silicon dioxide glass. The glass may be a silicate-based glass (e.g., lithium-silicate, borosilicate, aluminum silicate, etc.). The substrate may also include crystalline or partially crystalline silicon oxide, such as quartz. In the example shown, the substrate 120 is formed from more than one layer 122. In one example, layers 122 may be bonded together to form the substrate 120, for example, using an adhesive layer 124. Other methods of bonding layers to form a substrate 120 are also within the scope of the invention. Selected examples may include multiple different materials in the layers, for example, glass and quartz. One advantage of glass substrates 120 over other materials such as resin-based substrates includes increased stiffness and reduced variability in dimensions. Additionally, glass or quartz substrates provide lower electrical loss compared to organic substrates. A layered substrate 120 provides ease of manufacturing for more complex geometries, such as inclusion of cavities, etc. in the substrate 120. In the example of FIG. 1, a high-Q passive device is shown incorporated on a left side of the substrate 120. One example of a high-Q passive includes an inductor. Other examples include, but are not limited to, resistors and capacitors.

A microelectromechanical systems (MEMS) die 130 is shown located within the substrate, and below one or more of the dies 110, 112. One or more vias 114 are shown coupled between one or more dies 110, 112 and the MEMS die 130. The one or more first vias 114 are shown passing through a portion of the substrate 120. In one example one or more second vias 116 are shown passing through all of the substrate 120 and contacting the redistribution layers 126 to bypass the MEMS die 130. In one example, the one or more second vias 116 include power connections to one or more of the dies 110, 112.

In one example, the MEMS die is a resonator die. In one example, the MEMS die includes at least one resonator device. In one example, the resonator device includes one or more thin film piezoelectric on substrate (TPoS) resonators as described in more detail below, although other resonator devices are within the scope of the invention. In one example, the MEMS die includes multiple resonator devices. A MEMS die with multiple resonators has an advantage of being able to supply multiple resonator frequencies that may be used in different device configurations with a single MEMS die. In one example, the MEMS die 130 provides a clock signal for both dies 110 and 112, and can provide a clock signal for more than two dies. In one example the MEMS die 130 further includes a temperature sensor to measure and compensate for temperature related effects in providing a clock signal. In one example, a temperature sensor is placed on the MEMS die in close proximity (for example within a few hundred micrometers) of a resonator device, enabling highly accurate temperature measurement of the resonator device.

A quartz crystal device is commonly used in computing devices to provide a reference clock frequency. However, quartz crystals are typically separate components that are quite large, and are coupled to a motherboard adjacent to a die package. This configuration takes up a lot of valuable real estate in a time when miniaturized devices such as telephones, watches, etc. are increasingly driven to smaller form factors. By incorporating a MEMS resonator device within a substrate 120 an overall size of a final electronic device is reduced, and manufacturing may be simplified. Additionally, by incorporating resonator device and MEMS dies as described in the present disclosure, a routing distance is greatly reduced between a processor and a resonator, which greatly reduces any parasitics and enables the creation of a GHz range reference clock.

In one example, a cavity 132 is included within the substrate 120 adjacent to the MEMS die 130. The cavity may include a vacuum to provide operating conditions for one or more MEMS devices formed in the MEMS die 130. In one example, the MEMS die 103 is sealed within the substrate 120 to enclose the cavity 132. In one example, a sealant 134 is used. One example of a sealant 134 includes a solder. A solder sealant 134 is useful in that it is compatible with other materials in the electronic device 100, and is easily processed using existing manufacturing techniques to provide the unique configuration of FIG. 1 and other configurations in the present disclosure. Using examples of the present disclosure, there is no need for a separate wafer level packaging for a MEMS die. The substrate 120 serves as a package for the die 130.

Figure 2:
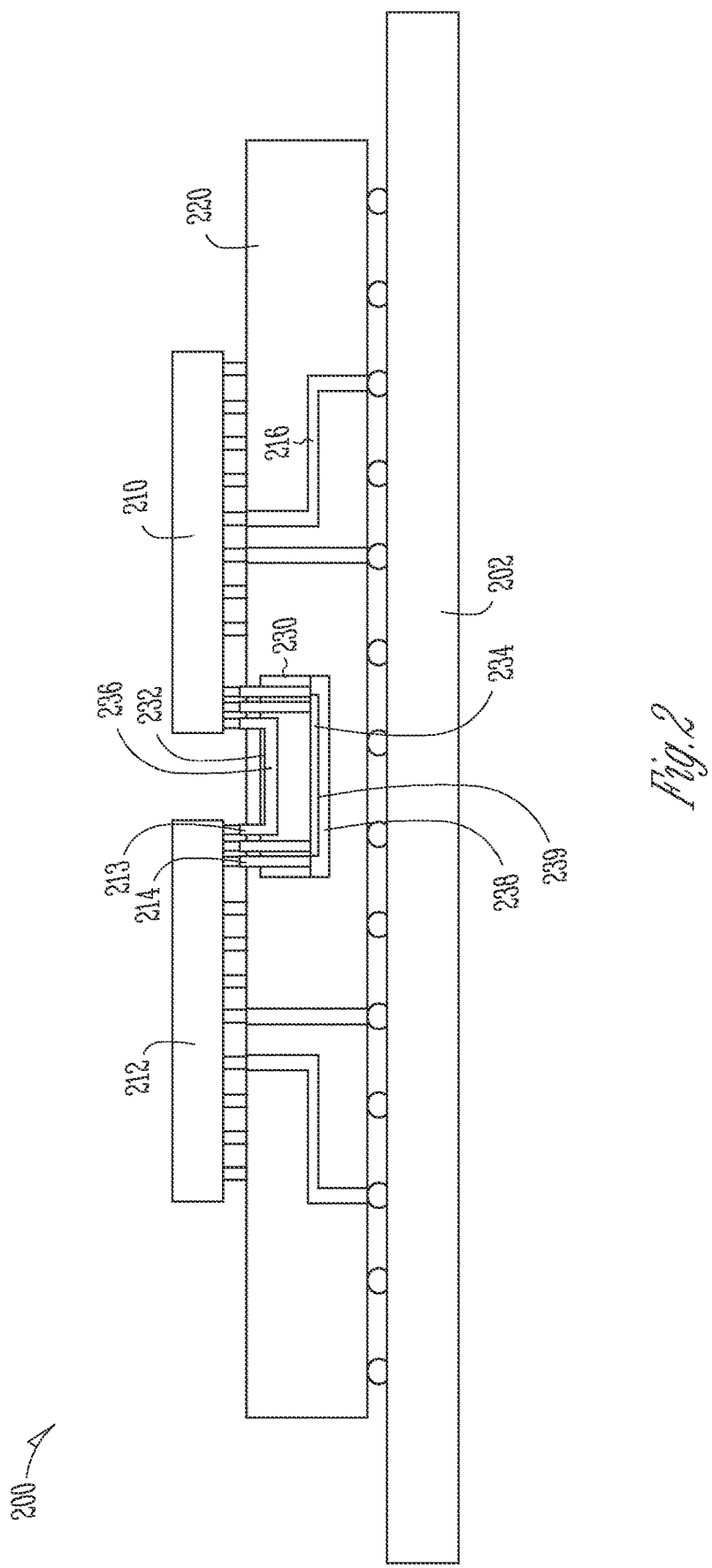
FIG. 2 shows another electronic device having a resonator die in accordance with some example embodiments.

FIG. 2 shows another electronic device 200 according to one example. The electronic device 200 includes a first semiconductive die 210 and a second semiconductive die 212. Similar to the example of FIG. 2, the dies 210, 212 are shown coupled to a substrate 220. In one example, one or more of the dies 210, 212 includes a processor die or processor core. Other example dies include controller dies, memory dies, etc. Although two dies are shown in FIG. 2, the invention is not so limited. More than two dies may be used in configurations of the present disclosure. FIG. 2 further shows a circuit board 202 coupled to the substrate 220.

In one example, the substrate 220 is a glass substrate, although the invention is not so limited. Examples of a glass substrate 120 include silicon dioxide glass. The glass may be a silicate-based glass (e.g., lithium-silicate, borosilicate, aluminum silicate, etc.). The substrate may also include crystalline or partially crystalline silicon oxide, such as quartz. The substrate 220 may include multiple layers as described in FIG. 1. The substrate 220 may include one or more redistribution layers as described in FIG. 1. In selected examples, the substrate 220 includes organic materials. In selected examples, the substrate 220 is not glass.

A die 230 is shown located within the substrate 220, and below one or more of the dies 210, 212. The die 230 includes a top side 232 and a bottom side 234. In one example, each side 232, 234 includes functional devices as described in more detail below. One or more first vias 213 are shown coupled between one or more dies 210, 212 and the top side 232. One or more second vias 214 are shown passing through the die 230 and coupled between one or more dies 210, 212 and the bottom side 234. In one example one or more third vias 216 are shown passing through all of the substrate 220. In one example, the one or more second vias 216 include power connections to one or more of the dies 210, 212.

In one example, the top side 232 includes an interconnect bridge die, and the bottom side 234 includes a MEMS die. In one example, the MEMS die includes one or more resonators similar to the MEMS die described above with respect to FIG. 1. In one example, the MEMS side of die 230 provides a clock signal for both dies 210 and 212, and can provide a clock signal for more than two dies. In one example the MEMS side of die 230 further includes a temperature sensor to measure and compensate for temperature related effects in providing a clock signal.

Although the interconnect bridge die is shown on the top 232 and the MEMS die is shown on the bottom 234, the invention is not so limited. The interconnect bridge die can also be on the bottom 234 and the MEMS die can be on the top 232.

In one example, an interconnect bridge includes all or primarily passive traces to interconnect between adjacent dies such as dies 210, 212. Traces 236 are shown in FIG. 2, connected to vias 213 to interconnect dies 210 and 212. By including all or primarily all passive traces, the interconnect bridge has a high manufacturing yield and can be manufactured using lithographic techniques to provide high trace density. In one example, the MEMS die components are manufactured on a common, monolithic semiconductor. In one example, the MEMS die components are manufactured on a common, monolithic glass or quartz substrate. In one example, the interconnect bridge and the MEMS die are manufactured separately, and joined back to back to form a two sided die 230. In one example, a thin film cap 238 is included on the MEMS die side (bottom side 234 in FIG. 2) to provide a vacuum cavity for operation of MEMS devices.

Figure 3:
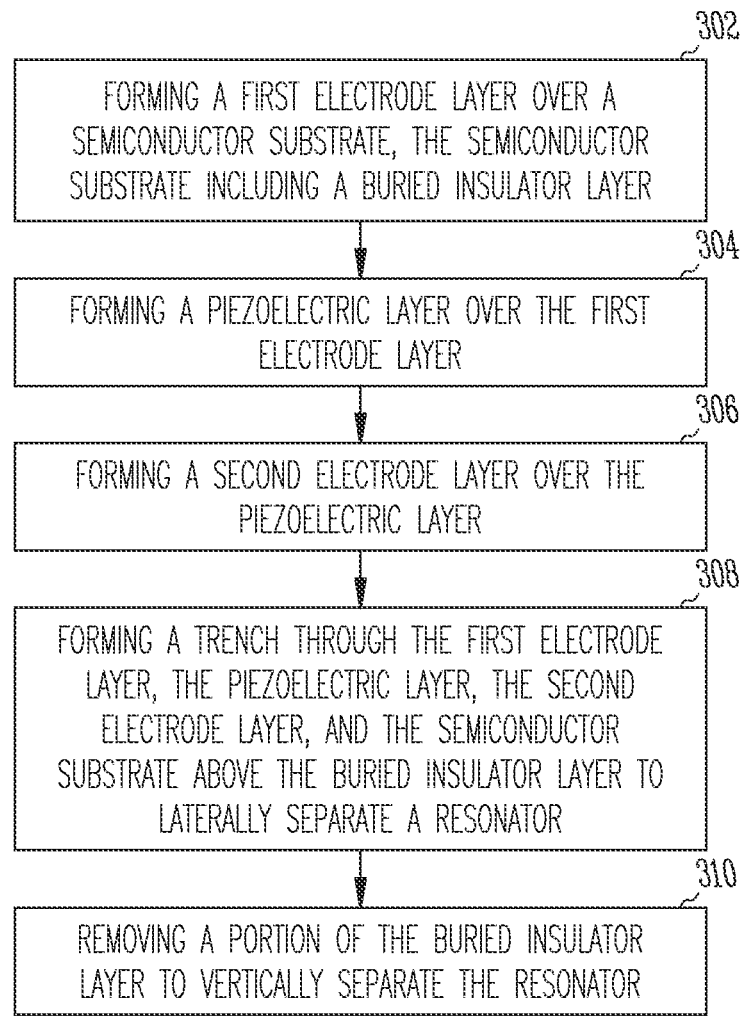
FIG. 3 shows a flow diagram of a method of manufacture of a resonator in accordance with some example embodiments.

FIG. 3 shows a flow diagram of one example method of forming a MEMS resonator device in a semiconductor substrate. The resulting MEMS resonator device may be used in any MEMS die or die surface as described in examples above. In operation 302, a first electrode layer is formed over a semiconductor substrate, the semiconductor substrate including a buried insulator layer. In operation 304, a piezoelectric layer is formed over the first electrode layer. In operation 306, a second electrode layer is formed over the piezoelectric layer. In operation 308, a trench is formed through the first electrode layer, the piezoelectric layer, the second electrode layer, and the semiconductor substrate above the buried insulator layer to laterally separate a resonator. Lastly, in operation 310, a portion of the buried insulator layer is removed to vertically separate the resonator.

Figure 4A:
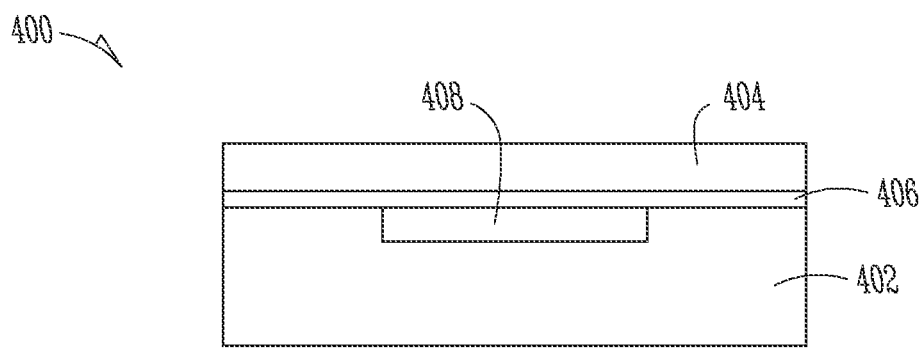
FIG. 4A-4C show intermediate steps of a method of manufacture of a resonator in accordance with some example embodiments.
Figure 4B:
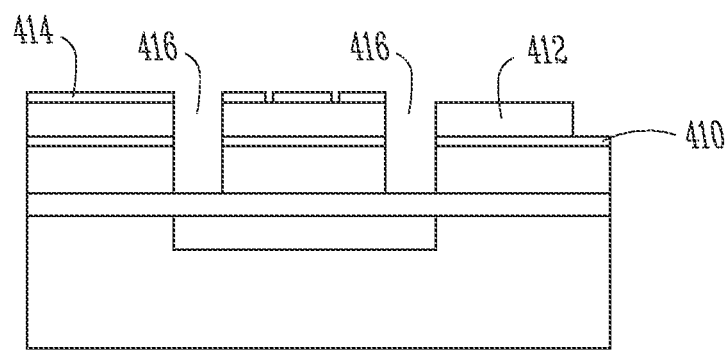
Figure 4C:
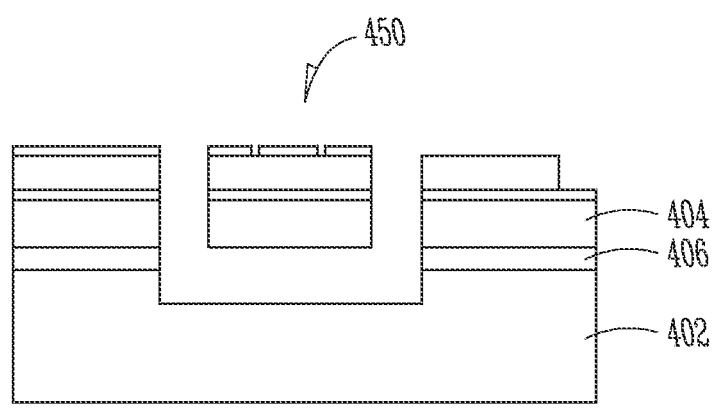

FIGS. 4A-4C, 5A-5B, and 6A-6C illustrate selected process flow stages of the method of FIG. 3 and others. FIG. 4A shows a substrate 400 including a bottom semiconductor portion 402, a top semiconductor portion 404, and a buried insulation layer 406. In one example, the substrate 400 is a cavity silicon-on-insulator (SOI) substrate, that includes one or more cavities 408. A cavity SOI substrate can be pre-manufactured, and start in the form illustrated in FIG. 4A. In FIG. 4B, a first electrode layer 410 is formed over portion 404, a piezoelectric layer 412 is formed over the first electrode layer 410, and a second electrode layer 414 is formed over the piezoelectric layer 412, trenches 416 are formed through the first electrode layer 410, the piezoelectric layer 412, and the second electrode layer 414, and into the top portion 404 of the semiconductor substrate 400 above the buried insulator layer 406 to laterally separate a resonator 450. In FIG. 4C, a portion of the buried insulator layer 406 is removed to vertically separate the resonator 450.

Figure 5A:
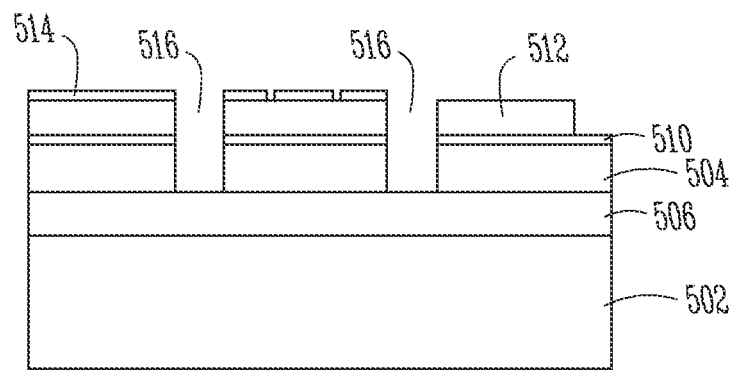
FIG. 5A-5B show intermediate steps of a method of manufacture of a resonator in accordance with some example embodiments.
Figure 5B:
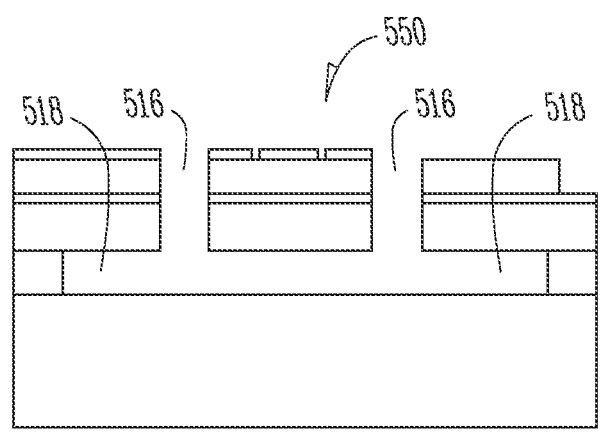

In FIGS. 5A-5B a different process is shown that does not include a cavity SOI substrate. In FIG. 5A, a substrate including a bottom semiconductor portion 502, a top semiconductor portion 504, and a buried insulation layer 506 is formed. In one example, the buried insulation layer 506 is a box oxide layer. In FIG. 5A, a first electrode layer 510 is formed over portion 504, a piezoelectric layer 512 is formed over the first electrode layer 510, and a second electrode layer 514 is formed over the piezoelectric layer 512, trenches 516 are formed through the first electrode layer 510, the piezoelectric layer 512, and the second electrode layer 514, and into the top portion 504 of the semiconductor substrate above the buried insulator layer 506 to laterally separate a resonator 550. In FIG. 5B, a portion of the buried insulator layer 506 is removed to vertically separate the resonator 550. As a result of etching the buried insulator layer 506, undercuts 518 are formed under portion 504 of the substrate.

Figure 6A:
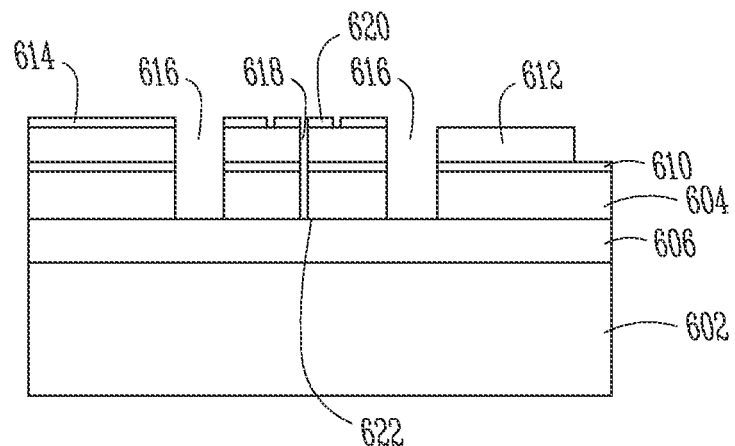
FIG. 6A-6C show intermediate steps of a method of manufacture of a resonator in accordance with some example embodiments.
Figure 6B:
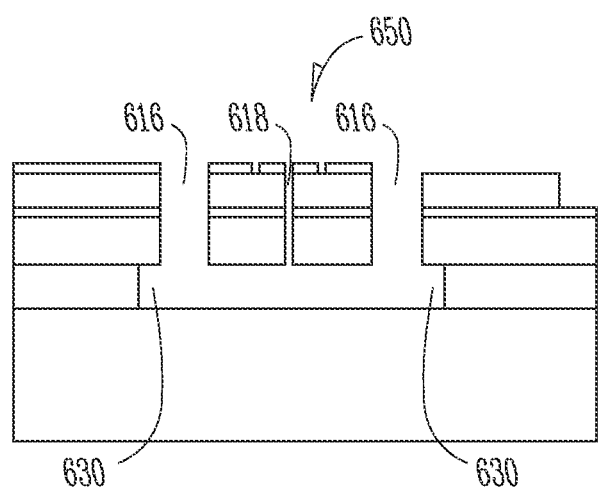
Figure 6C:
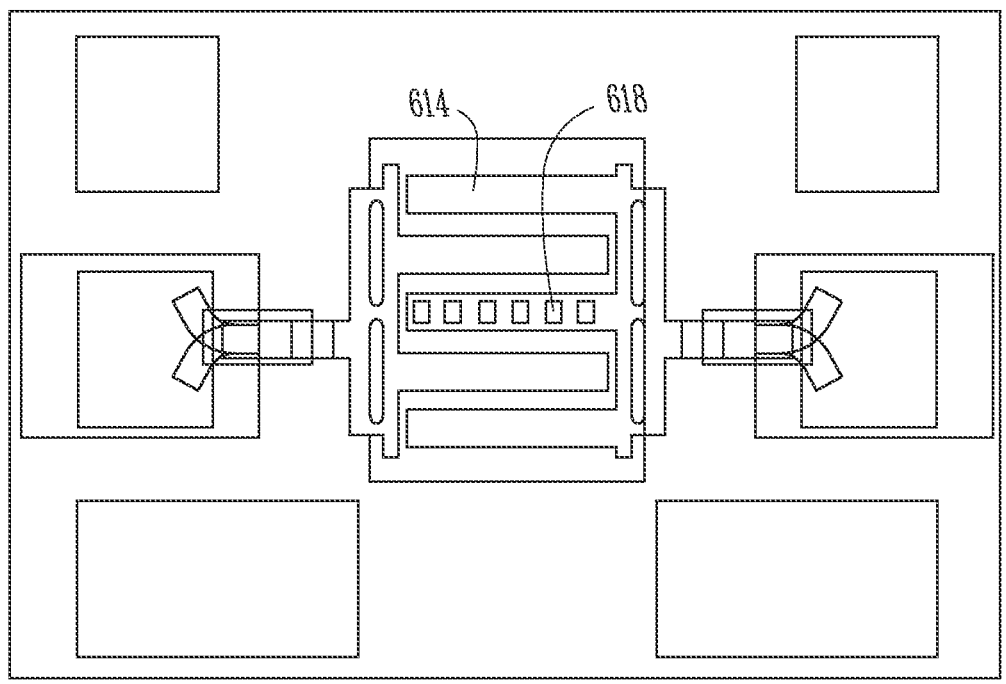

In FIGS. 6A-6C a different process is shown that includes additional holes through the resonator. The additional holes provide a number of advantages as described below. In FIG. 6A, a substrate including a bottom semiconductor portion 602, a top semiconductor portion 604, and a buried insulation layer 606 is formed. In one example, the buried insulation layer 606 is a box oxide layer. In FIG. 6A, a first electrode layer 610 is formed over portion 604, a piezoelectric layer 612 is formed over the first electrode layer 610, and a second electrode layer 614 is formed over the piezoelectric layer 612, trenches 616 are formed through the first electrode layer 610, the piezoelectric layer 612, and the second electrode layer 614, and into the top portion 604 of the semiconductor substrate above the buried insulator layer 606 to laterally separate a resonator 650. One or more holes 618 are also formed vertically through the resonator 650 from a top surface 620 to a bottom 622 of the resonator 650 before any removal of the buried insulator layer 606. In FIG. 6B, a portion of the buried insulator layer 606 is removed to vertically separate the resonator 650. Due to the presence of the one or more holes 618, a middle section of the buried insulator layer 606 is also exposed to etchant, which facilitates faster, more even etching of the buried insulator layer 606 in the desired region beneath the resonator 650. As a result, the undercuts 630 that are formed under portion 604 of the substrate are smaller than in the example of FIG. 5B.

FIG. 6C shows a top view of the resonator 650 with the top electrode 614 and the one or more holes 618 indicated. In addition to reducing the size of undercuts 630, the addition of one or more holes 618 as shown in FIG. 6A provides a resonance tuning advantage. The resonance frequency would be defined by the following equation with the resonator planar dimension $L_{eff}$, effective stiffness $E_{eff}$ (which would be defined by the stack of different materials in the resonator body), and the effective density for the stack of materials in the resonator body.

$$f_0 = \frac{1}{L_{eff}} \times \sqrt{\frac{E_{eff}}{\rho}}$$

For example, assume the case of under etch for any fabrication process inaccuracies. This would cause the size of the resonator to be larger than what is designed and the resonance frequency to be lower than the designed resonance frequency. By adding one or more holes 618 in the resonator 650, in the case of under etch, the holes 618 in the resonator would be smaller which means the effective stiffness would be higher, which would shift the resonance frequency up. In this way, the inclusion of one or more holes 618 compensates for any fabrication process inaccuracy and eliminates the need for subsequent coarse frequency trimming.

Figure 7:
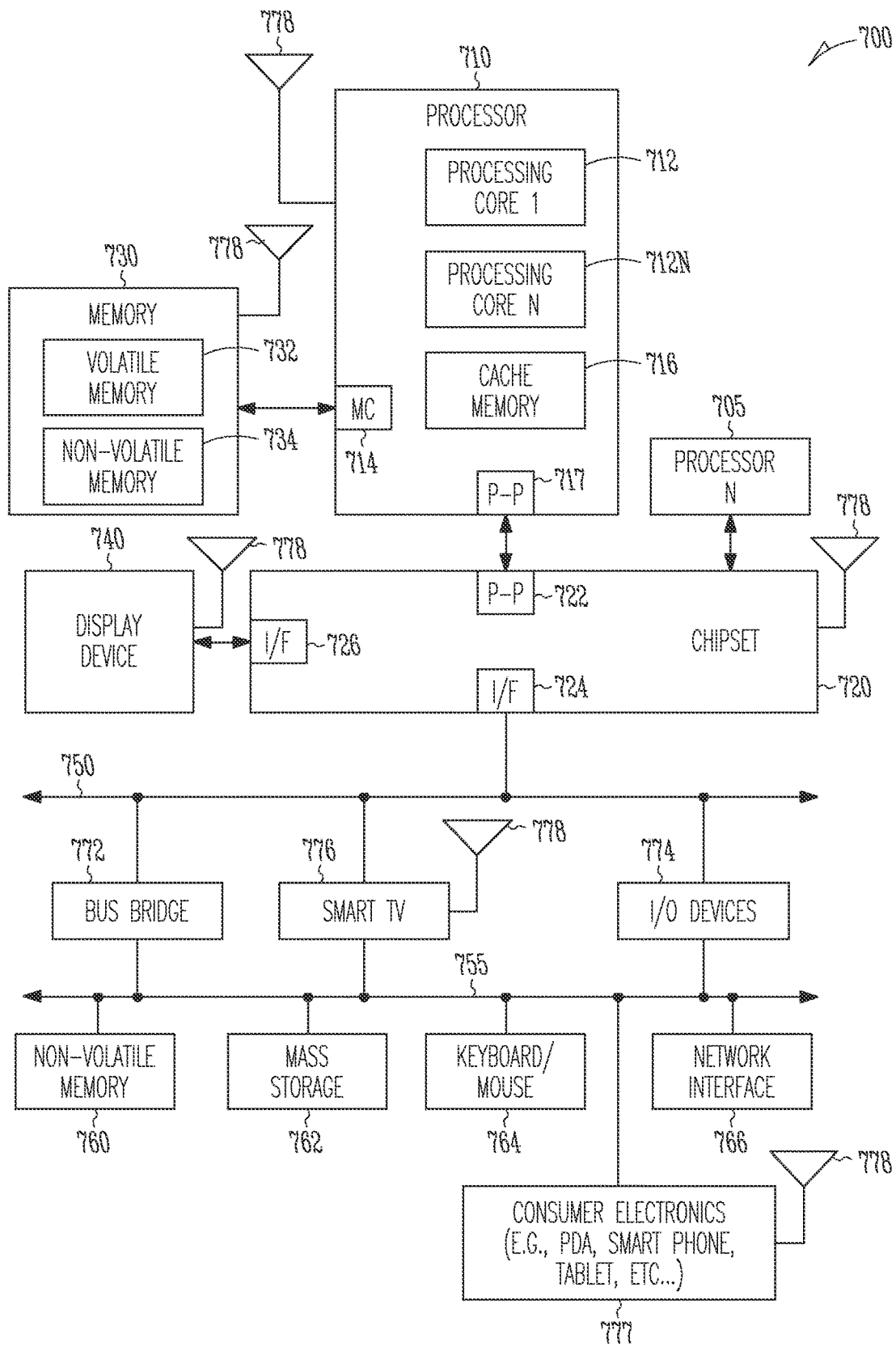
FIG. 7 shows a system that may incorporate an electronic device having a resonator die and methods, in accordance with some example embodiments.

FIG. 7 illustrates a system level diagram, depicting an example of an electronic device (e.g., system) that may include an electronic device including one or more MEMS devices and dies and/or methods described above. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 includes a system on a chip (SOC) system.

In one embodiment, processor 710 has one or more processor cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, an interface for wireless antenna 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the example system, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices, including a bus bridge 772, a smart TV 776, I/O devices 774, nonvolatile memory 760, a storage medium (such as one or more mass storage devices) 762, a keyboard/mouse 764, a network interface 766, and various forms of consumer electronics 777 (such as a PDA, smart phone, tablet etc.), etc. In one embodiment, chipset 720 couples with these devices through an interface 724. Chipset 720 may also be coupled to a wireless antenna 778 to communicate with any device configured to transmit and/or receive wireless signals. In one example, any combination of components in a chipset may be separated by a continuous flexible shield as described in the present disclosure.

Chipset 720 connects to display device 740 via interface 726. Display 740 may be, for example, a liquid crystal display (LCD), a light emitting diode (LED) array, an organic light emitting diode (OLED) array, or any other form of visual display device. In some embodiments of the example system, processor 710 and chipset 720 are merged into a single SOC. In addition, chipset 720 connects to one or more buses 750 and 755 that interconnect various system elements, such as I/O devices 774, nonvolatile memory 760, storage medium 762, a keyboard/mouse 764, and network interface 766. Buses 650 and 755 may be interconnected together via a bus bridge 772.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the method and apparatuses disclosed herein, a non-limiting list of embodiments is provided here:

Example 1 includes an electronic device. The device includes a processor die coupled to a substrate, a microelectromechanical systems (MEMS) resonator die located within the substrate, and below the processor die, and one or more vias coupled between the processor die and the MEMS resonator die, the one or more vias passing through a portion of the substrate.

Example 2 includes the electronic device of example 1, further including a temperature sensor.

Example 3 includes the electronic device of any one of examples 1-2, wherein the substrate includes a glass substrate.

Example 4 includes the electronic device of any one of examples 1-3, further including a cavity below the MEMS resonator die.

Example 5 includes the electronic device of any one of examples 1-4, wherein the substrate includes multiple layers of glass bonded together.

Example 6 includes the electronic device of any one of examples 1-5, wherein the MEMS resonator die is sealed over a cavity using solder.

Example 7 includes the electronic device of any one of examples 1-6, further including a redistribution layer on a bottom of substrate opposite the processor die.

Example 8 includes the electronic device of any one of examples 1-7, wherein the MEMS resonator die is formed in a silicon-on-insulator (SOI) surface.

Example 9 includes the electronic device of any one of examples 1-8, wherein the MEMS resonator die includes a thin film piezoelectric on substrate (TPoS) resonator.

Example 10 includes the electronic device of any one of examples 1-9, wherein the TPoS resonator includes a buried oxide layer with an undercut on sides of resonator.

Example 11 includes the electronic device of any one of examples 1-10, wherein the TPoS resonator includes one or more holes vertically passing through the resonator.

Example 12 includes an electronic device. The device includes a first semiconductive die and a second semiconductive die coupled to a substrate, and an interconnect bridge at least partially within the substrate, the interconnect bridge having a first side, and a second side opposite the first side, wherein the first side of the interconnect bridge is coupled between the first semiconductive die and the second semiconductive die. The device includes a microelectromechanical systems (MEMS) resonator device located on the second side of the interconnect bridge, and one or more vias coupled between at least one of the first semiconductive die and the second semiconductive die and the MEMS resonator device, the one or more vias passing through the interconnect bridge.

Example 13 includes the electronic device of example 12, further including a cavity over the MEMS resonator device.

Example 14 includes the electronic device of any one of examples 12-13, wherein the interconnect bridge includes a silicon substrate.

Example 15 includes the electronic device of any one of examples 12-14, wherein the interconnect bridge includes a glass substrate.

Example 16 includes the electronic device of any one of examples 12-15, wherein the interconnect bridge includes a quartz substrate.

Example 17 includes the electronic device of any one of examples 12-16, wherein the MEMS resonator device includes one or more thin film piezoelectric on substrate (TPoS) resonators.

Example 18 includes the electronic device of any one of examples 12-17, wherein the TPoS resonator includes a buried oxide layer with an undercut on sides of resonator.

Example 19 includes the electronic device of any one of examples 12-18, wherein the TPoS resonator includes one or more holes vertically passing through the resonator.

Example 20 includes the electronic device of any one of examples 12-19, wherein the MEMS resonator device includes multiple thin film piezoelectric on substrate (TPoS) resonators configured to provide more than one frequency.

Example 21 includes the electronic device of any one of examples 12-20, wherein the MEMS resonator device is formed in a silicon-on-insulator (SOI) surface.

Example 22 includes a method of forming a microelectromechanical systems (MEMS) resonator. The method includes forming a first electrode layer over a semiconductor substrate, the semiconductor substrate including a buried insulator layer, forming a piezoelectric layer over the first electrode layer, forming a second electrode layer over the piezoelectric layer, forming a trench through the first electrode layer, the piezoelectric layer, the second electrode layer, and the semiconductor substrate above the buried insulator layer to laterally separate a resonator, and removing a portion of the buried insulator layer to vertically separate the resonator.

Example 23 includes the method of example 22, wherein forming the first electrode layer over the semiconductor substrate includes forming the first electrode layer over a cavity in a cavity-SOI substrate.

Example 24 includes the method of any one of examples 22-23, wherein forming the first electrode layer over the semiconductor substrate includes forming the first electrode layer over a layer of semiconductor separated from a bulk semiconductor by the box oxide layer, and wherein removing a portion of the buried insulator layer includes etching a portion of the box oxide layer, and forming undercuts on sides of the resonator.

Example 25 includes the method of any one of examples 22-24, further including forming one or more holes vertically through the resonator before removing the portion of the buried insulator layer, and at least partially removing the portion of the buried insulator layer by introducing an etchant through the one or more holes.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. An electronic device, comprising:
a processor die coupled to a substrate;
a microelectromechanical systems (MEMS) resonator die located within the substrate, and below the processor die; and
one or more first vias coupled between the processor die and the MEMS resonator die, the one or more first vias passing through a portion of the substrate; and
one or more second vias coupled between the processor die and a backside of the substrate, below the MEMS resonator die.

2. The electronic device of claim 1, further including a temperature sensor.

3. The electronic device of claim 1, wherein the substrate includes a glass substrate.

4. The electronic device of claim 1, further including a cavity below the MEMS resonator die.

5. The electronic device of claim 1, wherein the substrate includes multiple layers of glass bonded together.

6. The electronic device of claim 1, wherein the MEMS resonator die is sealed over a cavity using solder.

7. The electronic device of claim 1, further including a redistribution layer on a bottom of the substrate opposite the processor die.

8. The electronic device of claim 1, wherein the MEMS resonator die is formed in a silicon-on-insulator (SOI) surface.

9. The electronic device of claim 1, wherein the MEMS resonator die includes a thin film piezoelectric on substrate (TPoS) resonator.

10. The electronic device of claim 9, wherein the TPOS resonator includes a buried oxide layer with an undercut on sides of resonator.

11. The electronic device of claim 9, wherein the TPOS resonator includes one or more holes vertically passing through the resonator.

12. An electronic device, comprising:
  a first semiconductive die and a second semiconductive die coupled to a substrate;
  an interconnect bridge at least partially within the substrate, the interconnect bridge having a first side, and a second side opposite the first side, wherein the first side of the interconnect bridge is coupled between the first semiconductive die and the second semiconductive die;
  a microelectromechanical systems (MEMS) resonator device located on the second side of the interconnect bridge; and
  one or more vias coupled between at least one of the first semiconductive die and the second semiconductive die and the MEMS resonator device, the one or more vias passing through the interconnect bridge.

13. The electronic device of claim 12, further including a cavity over the MEMS resonator device.

14. The electronic device of claim 12, wherein the interconnect bridge includes a silicon substrate.

15. The electronic device of claim 12, wherein the interconnect bridge includes a glass substrate.

16. The electronic device of claim 12, wherein the interconnect bridge includes a quartz substrate.

17. The electronic device of claim 12, wherein the MEMS resonator device includes one or more thin film piezoelectric on substrate (TPoS) resonators.

18. The electronic device of claim 17, wherein the TPOS resonator includes a buried oxide layer with an undercut on sides of resonator.

19. The electronic device of claim 17, wherein the TPOS resonator includes one or more holes vertically passing through the resonator.

20. The electronic device of claim 12, wherein the MEMS resonator device includes multiple thin film piezoelectric on substrate (TPoS) resonators configured to provide more than one frequency.

21. The electronic device of claim 12, wherein the MEMS resonator device is formed in a silicon-on-insulator (SOI) surface.

* * * * *